US012707561B2

(12) United States Patent
Masaki et al.

(10) Patent No.: US 12,707,561 B2
(45) Date of Patent: Aug. 11, 2026

(54) MAGNETIC CERAMIC SUBSTRATE, SUBSTRATE MANUFACTURING METHOD, AND CIRCULATOR

(71) Applicant: Mitsubishi Electric Corporation, Tokyo (JP)

(72) Inventors: Motoki Masaki, Tokyo (JP); Takumi Nagamine, Tokyo (JP); Toshiyuki Moribayashi, Tokyo (JP); Tetsuya Ueda, Tokyo (JP); Hironobu Shibata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 280 days.

(21) Appl. No.: 18/708,252

(22) PCT Filed: Nov. 22, 2021

(86) PCT No.: PCT/JP2021/042724

§ 371 (c)(1),
(2) Date: May 8, 2024

(87) PCT Pub. No.: WO2023/089804

PCT Pub. Date: May 25, 2023

(65) Prior Publication Data

US 2025/0016919 A1 Jan. 9, 2025

(51) Int. Cl.
*H05K 1/03* (2006.01)
*H05K 1/02* (2006.01)

(52) U.S. Cl.
CPC ........... *H05K 1/0306* (2013.01); *H05K 1/024* (2013.01); *H05K 2201/0195* (2013.01); *H05K 2201/0338* (2013.01)

(58) Field of Classification Search
CPC ................. H05K 1/0306; H05K 1/024; H05K 2201/0195; H05K 2201/0338
See application file for complete search history.

(56) References Cited

U.S. PATENT DOCUMENTS

2014/0284088 A1 9/2014 Nakamura et al.

FOREIGN PATENT DOCUMENTS

| | | | |
|---|---|---|---|
| CN | 112010665 | A | 12/2020 |
| JP | S55-086195 | A | 6/1980 |
| JP | S58-116790 | A | 7/1983 |
| JP | S59-046098 | A | 3/1984 |
| JP | S60-167496 | A | 8/1985 |
| JP | S63-107093 | A | 5/1988 |
| JP | S63-244789 | A | 10/1988 |
| JP | H02-248398 | A | 10/1990 |
| JP | H02-267989 | A | 11/1990 |
| JP | H03-089590 | A | 4/1991 |

(Continued)

OTHER PUBLICATIONS

Extended European Search Report issued Dec. 18, 2024 in European Patent Application No. 21964819.3, 8 pages.

(Continued)

*Primary Examiner* — Jeremy C Norris
(74) *Attorney, Agent, or Firm* — XSENSUS LLP

(57) ABSTRACT

A magnetic ceramic substrate includes a base material made of magnetic ceramic and a conductor pattern formed to be in contact with a surface of the base material. The surface of the base material is smooth, and the conductor pattern contains a metal conductor and amorphous glass. A circulator includes the magnetic ceramic substrate.

10 Claims, 13 Drawing Sheets

(56) References Cited

FOREIGN PATENT DOCUMENTS

| | | | |
|---|---|---|---|
| JP | H08-084004 | A | 3/1996 |
| JP | H10-004304 | A | 1/1998 |
| JP | 2001-036312 | A | 2/2001 |
| JP | 2003-243804 | A | 8/2003 |
| JP | 2007-201346 | A | 8/2007 |
| JP | 2010-135602 | A | 6/2010 |
| JP | 2012-109148 | A | 6/2012 |
| JP | 2014-063780 | A | 4/2014 |
| JP | 2014-141374 | A | 8/2014 |
| JP | 2018-152218 | A | 9/2018 |
| JP | 6737506 | B2 | 8/2020 |
| WO | 2013/061727 | A1 | 5/2013 |

OTHER PUBLICATIONS

International Search Report and Written Opinion mailed on Feb. 15, 2022, received for PCT Application PCT/JP2021/042724, filed on Nov. 22, 2021, 9 pages including English Translation.

Notice of Reason for Refusal mailed on Aug. 30, 2022, received for JP Application 2022-535439, 7 pages including English Translation.

Notice of Reason for Refusal mailed on Jan. 10, 2023, received for JP Application 2022-535439, 7 pages including English Translation.

| | | EXAMPLE | | | | | | | | | | | | | COMPARATIVE EXAMPLE | | |
|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 1 | 2 | 3 |
| CONDUCTOR PATTERN | METAL CONDUCTOR | Ag | Ag | Ag | Ag | Ag | Ag | Ag | Ag | Ag | Ag | Ag | Ag | Ag | Ag | Ag | Ag |
| | GLASS TYPE | AMOR-PHOUS | AMOR-PHOUS | AMOR-PHOUS | AMOR-PHOUS | AMOR-PHOUS | AMOR-PHOUS | AMOR-PHOUS | AMOR-PHOUS | AMOR-PHOUS | AMOR-PHOUS | AMOR-PHOUS | AMOR-PHOUS | AMOR-PHOUS | AMOR-PHOUS | CRYSTAL-LINE | CRYSTAL-LINE |
| | CONTENT OF GLASS [vol%] | 6 | 6 | 6 | 6 | 3.5 | 8 | 12 | 2 | 14 | 6 | 6 | 6 | 6 | 6 | 6 | 20 |
| | THICKNESS [μm] | 15 | 16 | 15 | 18 | 17 | 16 | 15 | 18 | 14 | 14 | 15 | 17 | 14 | 15 | 15 | 16 |
| | DIFFERENCE BETWEEN SINTERING TEMPERATURE AND SOFTENING TEMPERATURE ($T_{sin}-T_{sof}$) [°C] | 300 | 300 | 300 | 300 | 300 | 300 | 300 | 300 | 300 | 100 | 400 | 70 | 440 | 300 | 300 | 300 |
| BASE MATERIAL OF MAGNETIC CERAMIC | SMOOTHING TREATMENT AFTER CUTTING | DONE | DONE | DONE | DONE | DONE | DONE | DONE | DONE | DONE | DONE | DONE | DONE | DONE | NOT DONE | DONE | DONE |
| | SURFACE SMOOTHNESS (Ra) [μm] | 0.05 | 0.12 | 0.5 | 0.8 | 0.07 | 0.06 | 0.05 | 0.07 | 0.08 | 0.06 | 0.08 | 0.06 | 0.06 | 1.6 | 0.06 | 0.05 |
| | THICKNESS [mm] | 1 | 1 | 1 | 1 | 1 | 1 | 1 | 1 | 1 | 1 | 1 | 1 | 1 | 1 | 1 | 1 |
| EVALUATION RESULT | ADHESION OF CONDUCTOR PATTERN (SAICAS STRENGTH OF EMXAMPLES AND COMPARATIVE EXAMPLES)/(SAICAS STRENGTH OF EXAMPLE 1) | 1 | 0.99 | 0.97 | 0.92 | 0.94 | 1.01 | 1.04 | 0.92 | 1.04 | 1.01 | 0.99 | 0.96 | 0.94 | 0.74 | 0.79 | 0.96 |
| | PLATING ADHESION OF CONDUCTOR PATTERN SURFACE | ◎ | ◎ | ◎ | ◎ | ◎ | ◎ | ◎ | ◎ | ○ | ◎ | ◎ | ○ | ◎ | ○ | ○ | × |

20
5
4
3
17b
15b
12
13
16
15a
17a

MAGNETIC CERAMIC SUBSTRATE, SUBSTRATE MANUFACTURING METHOD, AND CIRCULATOR

CROSS-REFERENCE TO RELATED APPLICATION

This application is a national stage application, pursuant to 35 U.S.C. § 371, of International Patent Application No. PCT/JP2021/042724, filed Nov. 22, 2021, the entire contents of which are incorporated herein by reference.

TECHNICAL FIELD

The present disclosure relates to a magnetic ceramic substrate employed for a circuit board which utilizes magnetic properties of an electronic device, a substrate manufacturing method which manufactures the magnetic ceramic substrate, and a circulator which employs the magnetic ceramic substrate.

BACKGROUND ART

A transmission/reception circuit of an electronic device uses a circulator which controls a transmission signal flow and a reception signal flow and which enables sharing of an antenna. On a ceramic circuit board used for the circulator, a circuit pattern is formed by metallizing a surface of a magnetic ceramic substrate. A circuit pattern forming method using generally employed thick-film printing is simple and excellent for mass production. However, with this circuit pattern forming method, it is difficult to ensure adhesion between a ceramic base material and a conductor pattern and to thereby improve reliability. Further, when a conductor paste containing a large amount of glass frit is used to improve the adhesion of the conductor pattern, plating adhesion when plating a surface of the conductor lowers.

In view of this, Patent Literature 1 proposes a circuit board formed by applying a first paste to a surface of a ceramic substrate, baking the first paste to form a first metallized layer having high adhesion, applying a second paste to the formed first metallized layer, and baking the second paste to form a second metallized layer having high heat-dissipation properties. In the second paste, a proportion of glass component to metal particle component is smaller than in the first paste.

CITATION LIST

Patent Literature

Patent Literature 1: JP 2007-201346 A

SUMMARY OF INVENTION

Technical Problem

In the circuit board proposed by Patent Literature 1, a first paste contains a glass component so adhesion between the ceramic substrate and the conductor is improved. However, there is a problem that when a thermal stress such as a heat cycle is applied to the interface, sometimes the conductor separates.

The present disclosure has as its objective to provide a magnetic ceramic substrate fabricated by forming a conductor pattern on a base material of magnetic ceramic, wherein the magnetic ceramic substrate has excellent adhesion between the conductor pattern and the base material and excellent plating adhesion on a surface of the conductor pattern.

Solution to Problem

A magnetic ceramic substrate according to the present disclosure includes:

a base material made of magnetic ceramic; and a conductor pattern formed to be in contact with a surface of the base material, wherein the surface of the base material is smooth, and wherein the conductor pattern contains a metal conductor and amorphous glass.

Advantageous Effects of Invention

According to the present disclosure, a conductor pattern contains amorphous glass so adhesion between the conductor pattern and a base material is improved. If an amount of amorphous glass is appropriate, the amorphous glass does not adversely influence plating adhesion on a surface of the conductor pattern. Therefore, according to the present disclosure, it is possible to provide a magnetic ceramic substrate fabricated by forming a conductor pattern on a base material of magnetic ceramic, wherein the magnetic ceramic substrate has excellent adhesion between the conductor pattern and the base material and excellent plating adhesion on a surface of the conductor pattern.

BRIEF DESCRIPTION OF DRAWINGS

FIG. 10 is a sectional schematic diagram of a magnetic ceramic substrate 1 according to Embodiment 1 in which the conductor pattern 5 has a two-layer structure.

FIG. 11 is a table that summarizes examples and comparative examples according to Embodiment 1.

DESCRIPTION OF EMBODIMENTS

As a method of forming a conductor pattern on a surface of a base material of sintered magnetic ceramic, there is a known method of printing a conductor pattern on a surface of a base material of magnetic ceramic and baking the printed conductor paste. In this case, the conductor paste is loaded with glass serving as a binding agent. However, this method has a problem that when a loading amount of glass is small, an effect of improving adhesion may not be obtained as expected. Further, if the loading amount of glass to the conductor paste is extremely increased to enhance the adhesion improving effect, glass floating increases on a surface of the conductor pattern to degrade plating adhesion. Meanwhile, featuring a stress on an interface of the base material of the magnetic ceramic and the conductor pattern after baking, a stress is generated on the interface of the base material of the magnetic ceramic and the conductor pattern due to a difference in coefficient of thermal expansion between the base material of the magnetic ceramic and the conductor pattern. If the surface of the base material of the magnetic ceramic has a large surface roughness, a problem arises that the stress concentrates on small protrusions existing on the surface of the base material of the magnetic ceramic, so small cracks may be formed in the surface of the base material of the magnetic ceramic (the interface of the base material of the magnetic ceramic and the conductor pattern). The cracks tend to be formed particularly in a low-hardness base material of magnetic ceramic. Also, the cracks may cause separation of the conductor pattern.

In view of this, the present inventors made intensive studies to solve the above problems, and have discovered that, in a magnetic ceramic substrate fabricated by forming a conductor pattern on a base material of magnetic ceramic, use of a base material having a smooth surface can reduce generation of small cracks caused by a difference in coefficient of thermal expansion between the base material and the conductor pattern. The present inventors have also discovered that if the conductor pattern contains a comparatively small amount of amorphous glass, the plating adhesion of the conductor pattern will not degrade while adhesion of the conductor pattern is improved. Note that amorphous glass has an excellent binding strength.

Embodiment 1

The present embodiment will be described below in detail with referring to drawings. Embodiment 1 relates to a magnetic ceramic substrate 1 having a base material 2 made of magnetic ceramic and a conductor pattern 5 formed to be in contact with a surface of the base material 2. The magnetic ceramic substrate 1 is characterized in that the surface of the base material 2 is smooth and the conductor pattern 5 contains amorphous glass 4.

Description of Configuration

Figure 1:
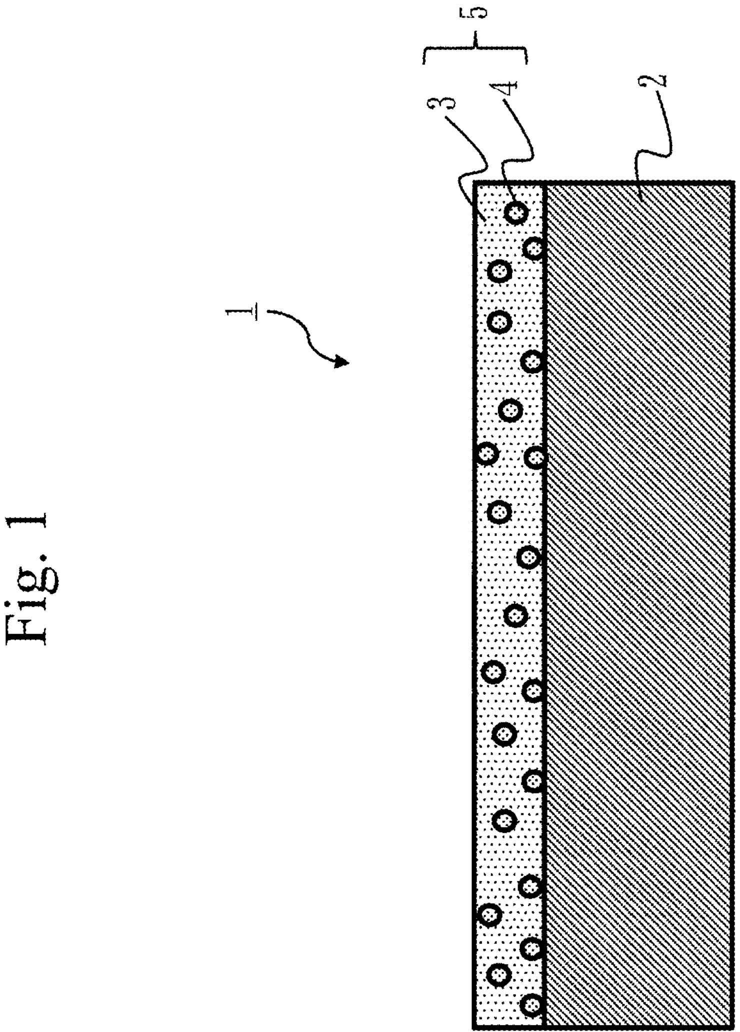
FIG. 1 is a sectional schematic diagram of a magnetic ceramic substrate 1 according to Embodiment 1.

FIG. 1 illustrates a specific example of a sectional schematic diagram of a magnetic ceramic substrate 1 according to Embodiment 1. As illustrated in FIG. 1, the magnetic ceramic substrate 1 is provided with a base material 2 and a conductor pattern 5.

Figure 3:
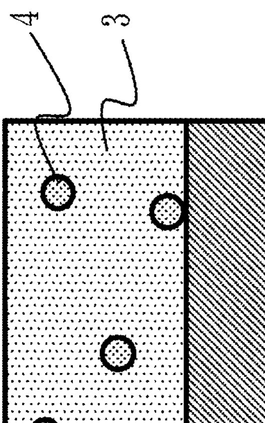
FIG. 3 is an enlarged schematic diagram of an interface formed of a conductor pattern 5 of the magnetic ceramic substrate 1 according to Embodiment 1 and a base material 2.

The base material 2 is made of magnetic ceramic and is used in the magnetic ceramic substrate 1. As illustrated in FIG. 1, a surface of the base material 2 has been treated by smoothing and is thus smooth. Since the surface of the base material 2 is smooth, even if a stress caused by a difference in coefficient of thermal expansion between the base material 2 and the conductor pattern 5 occurs on an interface formed of the base material 2 and the conductor pattern 5, microcracks 7 will not be easily formed in the base material 2, as illustrated in FIG. 3.

Figure 2:
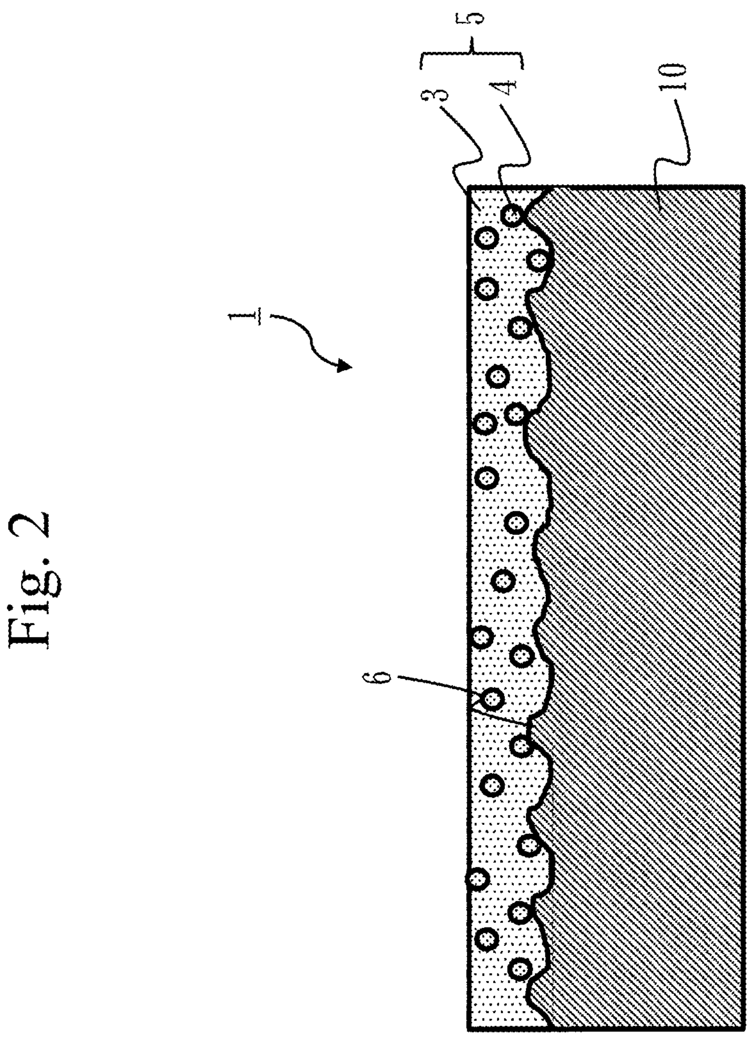
FIG. 2 is a sectional schematic diagram of a magnetic ceramic substrate 1 provided with a non-smooth base material 10.
Figure 4:
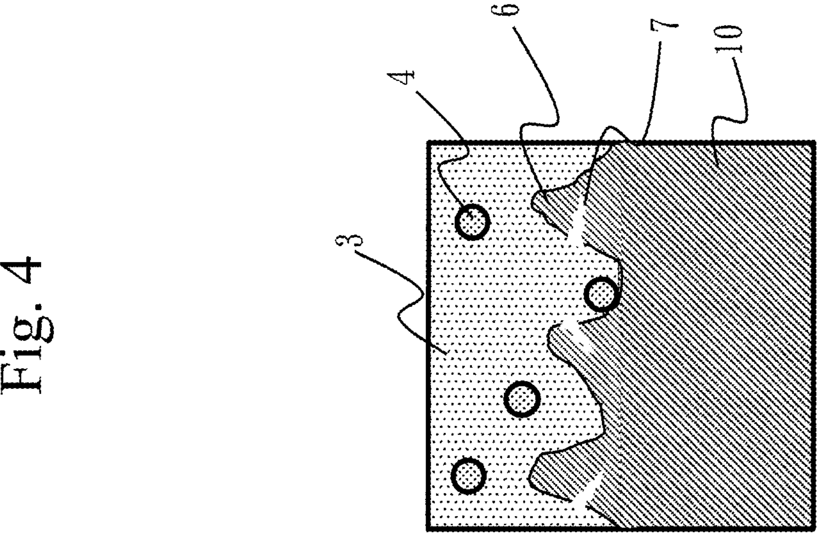
FIG. 4 is an enlarged schematic diagram of an interface formed of a conductor pattern 5 and the non-smooth base material 10 in the magnetic ceramic substrate 1 provided with the non-smooth base material 10.

A case will be considered in which a magnetic ceramic substrate 1 is provided with a non-smooth base material 10 in place of a base material 2, as illustrated in FIG. 2. The non-smooth base material 10 is a base material of magnetic ceramic whose surface has not been treated by smoothing. In this case, a stress caused by a difference in coefficient of thermal expansion between the base material 2 and a conductor pattern 5 concentrates on protrusions 6 existing on the surface of the base material 2. The protrusions 6 are formed because the surface of the base material 2 is not smooth. As a result, as illustrated in FIG. 4, microcracks 7 tend to be formed mainly in the protrusions 6, and adhesion of the conductor pattern 5 decreases starting at the formed microcracks 7.

Therefore, in the magnetic ceramic substrate 1, since the surface of the base material 2 is smooth, formation of the microcracks 7 is reduced, and a decrease in adhesion between the conductor pattern 5 and base material 2 is reduced.

Figure 5:
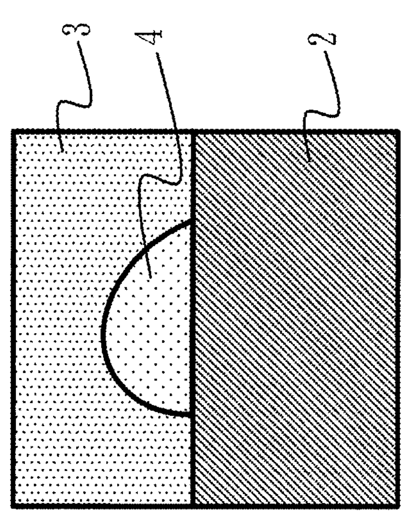
FIG. 5 is a schematic diagram illustrating a bonding state of amorphous glass 4 in the interface of the magnetic ceramic substrate 1 according to Embodiment 1.

The conductor pattern 5 is formed to be in contact with the surface of the base material 2. The conductor pattern 5 contains a metal conductor 3 and amorphous glass 4, thereby forming a structure in which the amorphous glass 4 is dispersed in the metal conductor 3. When the amorphous glass 4 fuses once in baking of the conductor pattern 5 and then solidifies again, the effect of the amorphous glass 4 as a binding agent will not decrease easily. Therefore, as illustrated in FIG. 5, the amorphous glass 4 is sufficiently bonded to the surface of the base material 2, contributing to improvement of the adhesion between the conductor pattern 5 and base material 2.

Figure 6:
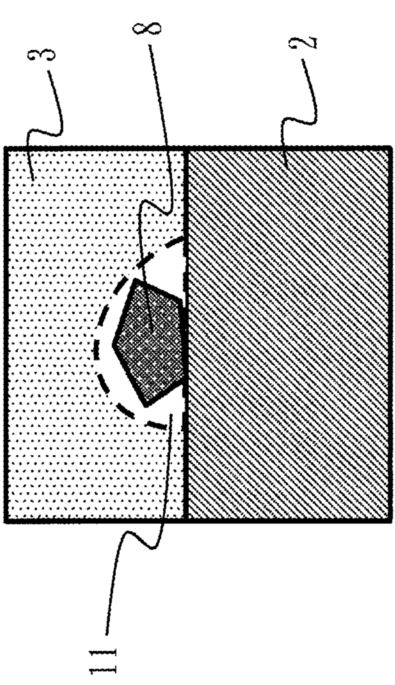
FIG. 6 is a schematic diagram illustrating a bonding state of crystalline glass 8 in an interface of a magnetic ceramic substrate 1 provided with a conductor pattern 5 containing the crystalline glass 8.
Figure 7:
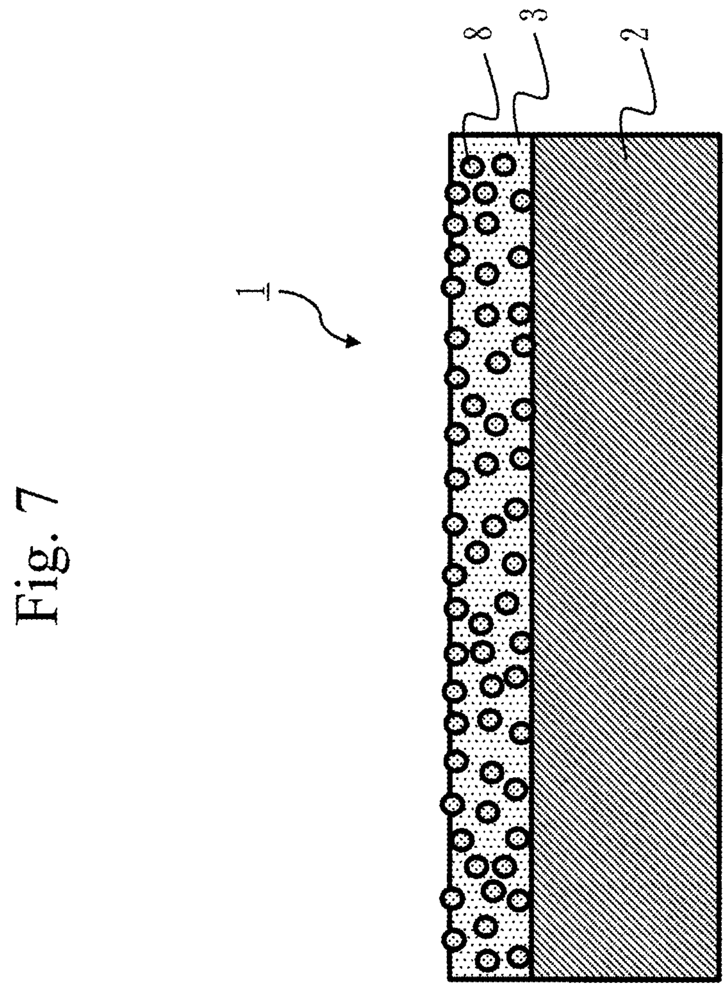
FIG. 7 is a sectional schematic diagram of the magnetic ceramic substrate 1 provided with the conductor pattern 5 containing the crystalline glass 8.

A case will be considered in which crystalline glass 8 is employed in the conductor pattern 5 in place of the amorphous glass 4. In this case, when the crystalline glass 8 fuses once in baking the conductor pattern 5 and then solidifies again, the effect of the crystalline glass 8 as the binding agent may decrease. As illustrated in FIG. 6, the crystalline glass 8 is crystallized in a process of solidification after it fuses once, but the crystalline glass 8 has such a nature that during crystallization, glass causes volumetric shrinkage, so a hardness of the crystalline glass 8 further increases. Also, a gap 11 may be formed when the crystalline glass 8 causes volumetric shrinkage. Hence, there is a case where the crystalline glass 8 is not sufficiently bonded to the surface of the base material 2 and does not provide a sufficient effect in improving the adhesion between the conductor pattern 5 and the base material 2. To sufficiently improve the adhesion between the conductor pattern 5 and the base material 2 by using the crystalline glass 8, a loading of the crystalline glass 8 may be increased extremely. If such a method is employed, however, floating glass on the surface of the conductor pattern 5 increases, as illustrated in FIG. 7. As a result, the plating adhesion on the surface of the conductor pattern 5 decreases.

Therefore, when the conductor pattern 5 employs the structure in which the amorphous glass 4 is dispersed in the metal conductor 3, both the adhesion between the conductor pattern 5 and base material 2 and the plating adhesion on the surface of the conductor pattern 5 improve.

Because of the above-mentioned configuration, the magnetic ceramic substrate 1 according to Embodiment 1 has excellent adhesion between the conductor pattern 5 and base material 2 and excellent plating adhesion on the surface of the conductor pattern 5.

The base material 2 may be any material that satisfies the magnetic properties required according to a use of the magnetic ceramic substrate 1. Specific examples of the material of the base material 2 include garnet-type ferrite ($YFe_5O_{12}$ and so on), M-type hexagonal ferrite ($BaFe_{12}O_{19}$, $SrFe_{12}O_{19}$), W-type hexagonal ferrite ($BaFe_{18}O_{27}$, $SrFe_{18}O_{27}$), Z-type hexagonal ferrite ($Ba_3Co_2Fe_{24}O_{41}$, $Sr_3Co_2Fe_{24}O_{41}$), Y-type hexagonal ferrite ($BaZnFe_{12}O_{22}$), and spinel-type ferrite ($AFe_2O_4$: A=Mn, Co, Ni, Cu, Zn). In particular, garnet-type ferrite having a small magnetic loss in a high-frequency range and highly demanded as a magnetic circuit board for microwaves is suitable as a material of the base material 2. Furthermore, the base material 2 preferably has a smooth surface from a viewpoint of reducing decrease in adhesion between the base material 2 and the conductor pattern 5. The base material 2 having a smooth surface means, as a specific example, after the base material 2 is cut, the surface of the base material 2 is treated by mirror polishing. The surface of the base material 2 may be smoothed by a method other than mirror polishing. Mirror polishing can employ a method such as buff polishing, barrel polishing, and shot-blast polishing. A value of Ra is preferably 0.01 or more and 0.5 or less and more preferably 0.02 or more and 0.3 or less where Ra is a smoothness of the surface of the base material 2. If the smoothness Ra on the surface of the base material 2 exceeds 0.5, a stress concentrating on protrusions of the surface of the base material 2 increases. Therefore, in this case, microcracks 7 may be formed in a rare case, and the adhesion between the conductor pattern 5 and the base material 2 tends to decrease slightly, although not so much as to impair practicality. On the other hand, if the smoothness Ra on the surface of the base material 2 is less than 0.01, mirror polishing will be performed excessively, resulting in a decrease in productivity. An arithmetic mean roughness (Ra) refers to a value calculated by [Formula 1] using data of surface unevenness of the base material 2, which is data obtained by measurement in a linear direction of a 10 mm-width length (l) using a laser displacement meter.

$$Ra = \frac{1}{l}\int_0^l |f(x)|dx \qquad \text{[Formula 1]}$$

The conductor pattern 5 is formed by printing a desired shape on the surface of the base material 2 by thick-film printing using a screen mask or a metal mask, and baking the printed shape at a desired temperature. At this time, a thickness of the conductor pattern 5 is 2 μm or more and 50 μm or less, preferably 5 μm or more and 30 μm or less, and more preferably 10 μm or more and 20 μm or less. If the thickness of the conductor pattern 5 is less than 2 μm, blurring of the conductor pattern 5 tends to occur in thick-film printing, and accordingly the productivity decreases. On the other hand, if the thickness of the conductor pattern 5 exceeds 50 μm, thermal shrinkage of the conductor pattern 5 during baking increases. Then, an internal stress occurring on the interface between the conductor pattern 5 and the base material 2 increases, and may accordingly induce separation of the conductor pattern 5. Note that the thickness of the conductor pattern 5 is a mean value of thicknesses of the conductor pattern 5 which are measured at 20 arbitrary locations in several pictures of a sectional surface of the magnetic ceramic substrate 1 photographed by a Scanning Electron Microscope (SEM) with a magnification of several hundred times to several thousand times.

The metal conductor 3 may be made of any material that can be baked at a temperature lower than a heat-resistant temperature of the base material 2 and that satisfies an electrical conductivity required according to the use of the magnetic ceramic substrate 1. Baking the metal conductor 3 at a temperature equal to or higher than a sintering temperature of the base material 2 is not preferable as it may cause distortion in the base material 2. Therefore, the baking temperature of the metal conductor 3 is preferably a temperature lower than the sintering temperature of the base material 2 by 300° C. or more, and more preferably a temperature lower than the sintering temperature by 400° C. or more. Specific examples of the material of the metal conductor 3 include Ag, Ag—Pd, and Cu.

The glass contained in the conductor pattern 5 is preferably amorphous glass 4. When the amorphous glass 4 fuses once in baking the conductor pattern 5 and then solidifies again, it still maintains the amorphous state. Therefore, the amorphous glass 4 tends to sufficiently show its effect as a binding agent which improves the adhesion between the conductor pattern 5 and the base material 2. Specific examples of the material of the amorphous glass 4 include zinc-based glass, silica-based glass, and bismuth-based glass. As the amorphous glass 4, any one of these glasses may be used alone, or two or more of these glasses may be used in combination.

A fusing temperature of the amorphous glass 4 is preferably such that a relationship between a softening point of the amorphous glass 4 and a sintering temperature of the metal conductor 3 satisfies the following where the softening point of the amorphous glass 4 is a fusion start temperature. That is, $T_{sin}-T_{sof}$ is preferably 100° C. or more and 300° C. or less where $T_{sof}$ is the softening temperature of the amorphous glass 4 contained in the conductor pattern 5 and $T_{sin}$ is the sintering temperature of the metal conductor 3 contained in the conductor pattern 5.

If $T_{sin}-T_{sof}$ is less than 100° C., the sintering temperature of the metal conductor 3 and the softening temperature of the amorphous glass 4 are too close, and accordingly after the metal conductor 3 is sintered densely, the amorphous glass 4 fuses. Then, the densely sintered metal conductor 3 serves as a lid, making it difficult for a gaseous component such as water vapor contained in the amorphous glass 4 to vent. As a result, an internal defect such as a void or swell of the conductor pattern 5 occurs.

On the other hand, if $T_{sin}-T_{sof}$ exceeds 300° C., the amorphous glass 4 will be heated at a temperature excessively higher than the softening temperature of the amorphous glass 4. Then, deficiencies may occur such as the amorphous glass 4 being altered chemically and crystallized partially. Further, since a viscosity of the fused amorphous glass 4 decreases excessively, the amorphous glass 4 tends to float on the surface of the conductor pattern 5 to decrease the plating adhesion properties on the surface of the conductor pattern 5. As a result, it becomes difficult to improve the adhesion and the plating adhesion stably.

Figure 8:
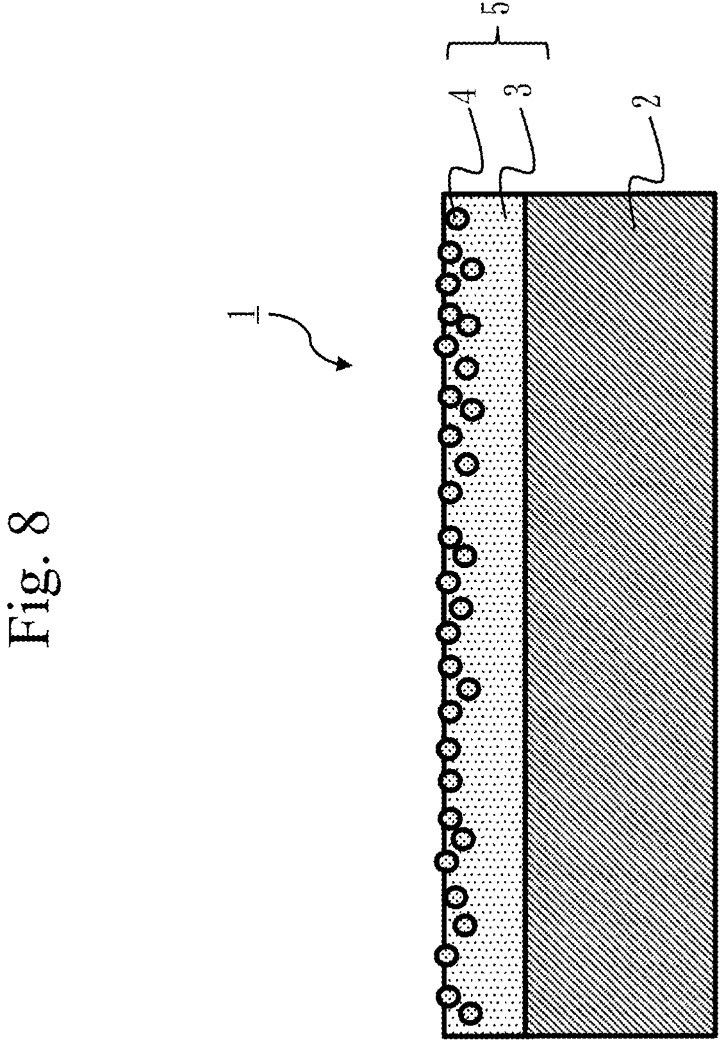
FIG. 8 is a sectional schematic diagram of a magnetic ceramic substrate 1 in which amorphous glass 4 is dispersed unevenly toward a surface side of a conductor pattern 5.
Figure 9:
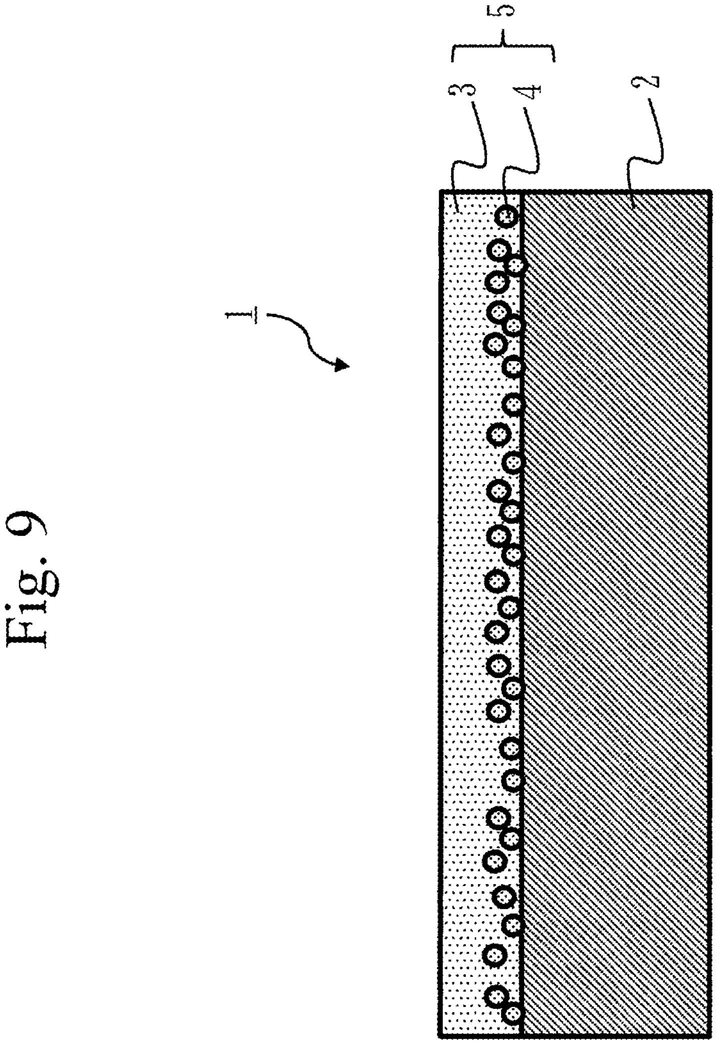
FIG. 9 is a sectional schematic diagram of the magnetic ceramic substrate 1 according to Embodiment 1.

Regarding a dispersed state of the amorphous glass 4 in the conductor pattern 5, from the viewpoint of improving the adhesion at the interface between the conductor pattern 5 and the base material 2, it suffices as far as the amorphous glass 4 is not dispersed toward a surface other than the interface of the conductor pattern 5 and the base material 2 as illustrated in FIG. 8, and as far as an amount of amorphous glass 4 contributing to adhesion at the interface is not very small. Hence, the amorphous glass 4 may be dispersed evenly as illustrated in FIG. 1, or may be dispersed unevenly toward an interface side of the conductor pattern 5 and the base material 2, as illustrated in FIG. 9.

A content of the amorphous glass 4 in the conductor pattern 5 suffices as far as it improves the adhesion of the conductor pattern 5 and does not interfere with the plating adhesion on the surface of the conductor pattern 5. An amount of amorphous glass 4 contained in the conductor pattern 5 is preferably 3.5 vol % or more and 12 vol % or less with respect to a volume of the conductor pattern 5, and is more preferably 5 vol % or more and 10 vol % or less with respect to the volume of the conductor pattern 5. In a case where the content of amorphous glass 4 with respect to the volume of the conductor pattern 5 is less than 3.5 vol %, if the amorphous glass 4 is not evenly dispersed in the conductor pattern 5, there is a possibility that an effect of improving the adhesion on the conductor pattern 5 cannot be obtained sufficiently. On the other hand, in a case where the content of amorphous glass 4 with respect to the volume of conductor pattern 5 exceeds 12 vol %, if the amorphous glass 4 is not evenly dispersed in the conductor pattern 5, particularly if the amorphous glass 4 is unevenly dispersed toward the surface side the of the conductor pattern 5, a plating adhesion on the surface of the conductor pattern 5 may be degraded.

Figure 10:
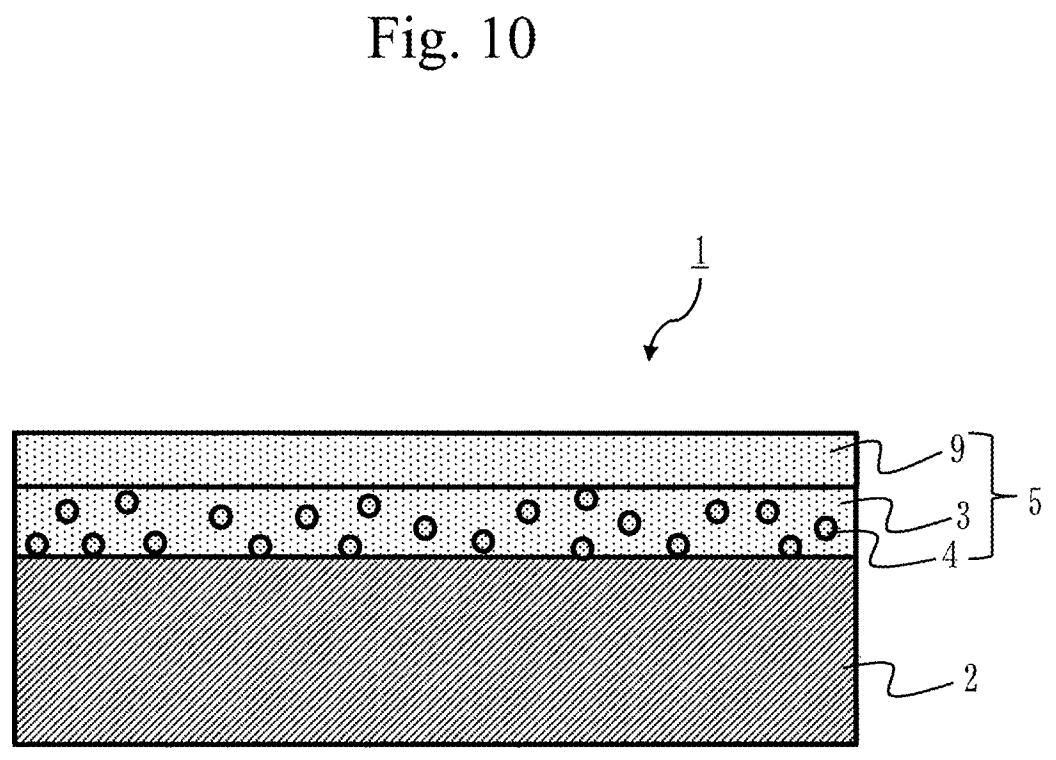

As illustrated in FIG. 10, the conductor pattern 5 may have a two-layer structure constituted of a first-layer conductor pattern being a conductor pattern as a first layer and a second-layer conductor pattern 9 being a conductor pattern as a second layer. The first-layer conductor pattern is formed to be in contact with a surface of the base material 2. The second-layer conductor pattern 9 is formed to be in contact with a surface of the first-layer conductor pattern. Here, the first-layer conductor pattern contains amorphous glass 4 and the second-layer conductor pattern 9 does not contain amorphous glass 4. With this structure, the plating adhesion on the surface of the conductor pattern 5 is further improves.

The magnetic ceramic substrate 1 with the above structure has excellent adhesion between the conductor pattern 5 and the base material 2, and excellent plating adhesion on the surface of the conductor pattern 5.

An example of a manufacturing method of the magnetic ceramic substrate 1 according to Embodiment 1 will now be described. The method of manufacturing the magnetic ceramic substrate 1 corresponds to a substrate manufacturing method.

First, a block of a sintered body of magnetic ceramic is cut into a desired size and a desired thickness to fabricate the base material 2. How to cut the block is not particularly limited, and a method that uses a blade cutter, a wire processing machine, an electric discharge machine, a laser beam machine, or an NC machine may be employed.

Next, a surface of the base material 2 that has been cut is mirror-polished. Mirror polishing only needs to be applied to at least a surface of the base material 2 on which the conductive paste is to be applied by thick film printing, and is applied to one or two surfaces of the base material 2. If mirror polishing is to be applied to the two surfaces of the base material 2, each surface may be mirror-polished separately, or the two surface may be mirror-polished simultaneously.

Next, a conductor paste is applied to the mirror-polished surface of the base material 2 by thick-film printing. The conductor paste contains the metal conductor 3 and the amorphous glass 4. A printing machine to be used in thick-film printing is not particularly limited, and may be a manual printing machine or an automatic printing machine. From the viewpoint of keeping constant printing and constant printing speed, the printing machine is preferably an automatic printing machine. A mask to be used for thick-film printing may be a screen mask, a metal mask, or the like. When printing a conductor pattern 5 having a more complicated shape, a screen mask is preferably used. After the conductor paste is applied by thick-film printing, the conductor paste is dried in a temperature controlled bath to remove a solvent component of the conductor paste. The drying temperature may be adjusted appropriately depending on a boiling point of the solvent component contained in the conductor paste, and is generally within a range of 80° C. to 200° C.

Next, the conductor paste applied to the base material 2 by thick-film printing is baked to the base material 2, thereby forming the conductor pattern 5. A device used for baking is not particularly limited, and may be a box-type kiln, a tube-type kiln, a belt conveyor-type kiln, or the like. The baking temperature may be adjusted appropriately depending on the type of the metal conductor 3 contained in the conductor paste, and is generally within a range of 600° C. to 1000° C.

That is, the substrate manufacturing method is a method of manufacturing the magnetic ceramic substrate 1 by mirror-polishing the surface of the base material 2 made of magnetic ceramic, applying the conductor paste containing the metal conductor 3 and the amorphous glass 4 by thick-film printing to the mirror-polished surface, drying the conductor paste applied by thick-film printing, and baking the dried conductor paste to the surface of the base material 2.

The magnetic ceramic substrate 1 manufactured in the above manner has excellent adhesion between the conductor pattern 5 and the base material 2 and excellent painting adhesion on the surface of the conductor pattern 5.

Description of Effect of Embodiment 1

Examples and comparative examples of the magnetic ceramic substrate 1 will be described below to describe an effect of Embodiment 1. FIG. 11 illustrates a table that summarizes results of evaluation of magnetic ceramic substrates 1 according to following examples and comparative examples. In FIG. 11, some fields are stippled to indicate differences from Example 1.

Example 1

First, a block of garnet-type ferrite ($YFe_5O_{12}$) was cut into a thickness of 1 mm by a grindstone cutter. After that, the surface of the cut object was mirror-polished for 30 minutes with a buff polisher, and a base material 2 having a surface roughness Ra of 0.05 μm was obtained.

Next, using an Ag paste containing 94 vol % of Ag powder and 6 vol % of zinc-based amorphous glass 4 having a softening temperature lower than that a sintering temperature of Ag by 300° C. as an inorganic component, screen printing was carried out on the surface of the base material 2 by an automatic printing machine. After that, the base material 2 was dried in a temperature-controlled bath at 120° C. for 20 minutes to remove a solvent.

Next, with a belt conveyor-type electric furnace, the base material 2 was subjected to baking process at a top temperature of 850° C. and at a speed of 60 minutes, from loading to the furnace and unloading from the furnace, thereby obtaining a magnetic ceramic substrate 1 for evaluation.

Example 2

Following the same procedure as that in Example 1 except that the surface was mirror-polished with a buffer polisher for 20 minutes instead of mirror-polishing the surface with a buffer polisher for 30 minutes, a magnetic ceramic substrate 1 for evaluation was obtained.

Example 3

Following the same procedure as that in Example 1 except that the surface was mirror-polished with a buffer polisher for 10 minutes instead of mirror-polishing the surface with a buffer polisher for 30 minutes, a magnetic ceramic substrate 1 for evaluation was obtained.

Example 4

Following the same procedure as that in Example 1 except that the surface was mirror-polished with a buffer polisher for 5 minutes instead of mirror-polishing the surface with a buffer polisher for 30 minutes, a magnetic ceramic substrate 1 for evaluation was obtained.

Example 5

Following the same procedure as that in Example 1 except that an Ag paste containing 3.5 vol % of amorphous glass 4 was used instead of an Ag paste containing 6 vol % of amorphous glass 4, a magnetic ceramic substrate 1 for evaluation was obtained.

Example 6

Following the same procedure as that in Example 1 except that an Ag paste containing 8 vol % of amorphous glass 4 was used instead of an Ag paste containing 6 vol % of amorphous glass 4, a magnetic ceramic substrate 1 for evaluation was obtained.

Example 7

Following the same procedure as that in Example 1 except that an Ag paste containing 12 vol % of amorphous glass 4 was used instead of an Ag paste containing 6 vol % of amorphous glass 4, a magnetic ceramic substrate 1 for evaluation was obtained.

Example 8

Following the same procedure as that in Example 1 except that an Ag paste containing 2 vol % of amorphous glass 4 was used instead of an Ag paste containing 6 vol % of amorphous glass 4, a magnetic ceramic substrate 1 for evaluation was obtained.

Example 9

Following the same procedure as that in Example 1 except that an Ag paste containing 14 vol % of amorphous glass 4 was used instead of an Ag paste containing 6 vol % of amorphous glass 4, a magnetic ceramic substrate 1 for evaluation was obtained.

Example 10

Following the same procedure as that in Example 1 except that silica-based amorphous glass 4 having a softening point lower than a sintering temperature of Ag by 100° C. was used instead of zinc-based amorphous glass 4 having a softening point lower than the sintering temperature of Ag by 300° C., a magnetic ceramic substrate 1 for evaluation was obtained.

Example 11

Following the same procedure as that in Example 1 except that bismuth-based amorphous glass 4 having a softening point lower than the sintering temperature of Ag by 400° C. was used instead of zinc-based amorphous glass 4 having a softening point lower than the sintering temperature of Ag by 300° C., a magnetic ceramic substrate 1 for evaluation was obtained.

Example 12

Following the same procedure as that in Example 1 except that silica-based amorphous glass 4 having a softening point lower than the sintering temperature of Ag by 70° C. was used instead of zinc-based amorphous glass 4 having a softening point lower than the sintering temperature of Ag by 300° C., a magnetic ceramic substrate 1 for evaluation was obtained.

Example 13

Following the same procedure as that in Example 1 except that bismuth-based amorphous glass 4 having a softening point lower than the sintering temperature of Ag by 440° C. was used instead of zinc-based amorphous glass 4 having a softening point lower than the sintering temperature of Ag by 300° C., a magnetic ceramic substrate 1 for evaluation was obtained.

Comparative Example 1

Following the same procedure as that in Example 1 except that the surface was not mirror-polished, a magnetic ceramic substrate 1 for evaluation was obtained.

Comparative Example 2

Following the same procedure as that in Example 1 except that zinc-based crystalline glass 8 was used instead of zinc-based amorphous glass 4, a magnetic ceramic substrate 1 for evaluation was obtained.

Comparative Example 3

Following the same procedure as that in Example 1 except that an Ag paste containing 20 vol % of zinc-based crystalline glass 8 was used instead of an Ag paste containing 6 vol % of zinc-based amorphous glass 4, a magnetic ceramic substrate 1 for evaluation was obtained.

Concerning the magnetic ceramic substrates 1 obtained in the above examples and comparative examples individually, the adhesion between the conductor pattern 5 and the base material 2 and the plating adhesion on the surface of the conductor pattern 5 were evaluated.

The adhesion was evaluated according to the SAICAS method by inserting a diamond blade horizontally to the interface of the conductor pattern 5 and the base material 2 and measuring a resistance encountered when cutting into the interface. An evaluation result of the adhesion is expressed by a relative value of a case where a value of a SAICAS strength in Example 1 is regarded as 1.

The plating adhesion was evaluated by visually observing a plating adhesion state of a case where the magnetic ceramic substrate 1 was treated by acidic electroless Ni plating. In evaluation results of the plating adhesion, "◎" signifies that the entire surface of the conductor pattern 5 is uniformly plated and thickness non-uniformity is not observed; "○" signifies that although the entire surface of the conductor pattern 5 is plated, some thickness non-uniformities are observed; and "x" signifies that areas where plating does not adhere to the surface of the conductor pattern 5 are noticeable.

As illustrated in FIG. 11, in Examples 1 to 13 where the surface of the magnetic ceramic was treated by smoothing, a relative value of the SAICAS strength was large and the adhesion of the conductor pattern 5 was improved. In particular, Examples in which the amorphous glass 4 had the same composition and the same content were compared with each other. In Examples 1 to 3 where the surface smoothness Ra was 0.05 to 0.5, the relative value of the SAICAS strength was large and the adhesion was good. In Examples 1 to 13 where the conductor pattern 5 contained amorphous glass 4, the plating adhesion on the surface of the conductor pattern 5 was good. In particular, in Examples 1 to 8, Examples 10 to 11, and Example 13 where the content of the amorphous glass 4 was 2 vol % to 12 vol %, the plating adhesion on the surface of the conductor pattern 5 was better.

On the other hand, in Comparative Example 1 where the surface of the base material 2 was not treated by smoothing and in Comparative Example 2 where the conductor pattern 5 contained crystalline glass 8, the relative value of the SAICAS strength was small and the adhesion of the conductor pattern 5 was bad. In Comparative Example 3 where the conductor pattern 5 contained as much as 20 vol % of crystalline glass 8, while the adhesion of the conductor pattern 5 was good, the plating adhesion on the surface of the conductor pattern 5 degraded.

As seen from the above results, according to Embodiment 1, a magnetic ceramic substrate 1 having excellent adhesion between the conductor pattern 5 and the base material 2 and excellent plating adhesion on the surface of the conductor pattern 5 can be provided.

Embodiment 2

Below, differences from the embodiment described above will be mainly explained with referring to drawings. Embodiment 2 relates to a circulator 20 provided with a magnetic ceramic substrate 1 characterized in that a surface of its base material 2 is smooth and that a conductor pattern 5 contains amorphous glass 4.

Description of Configuration

Figure 12:
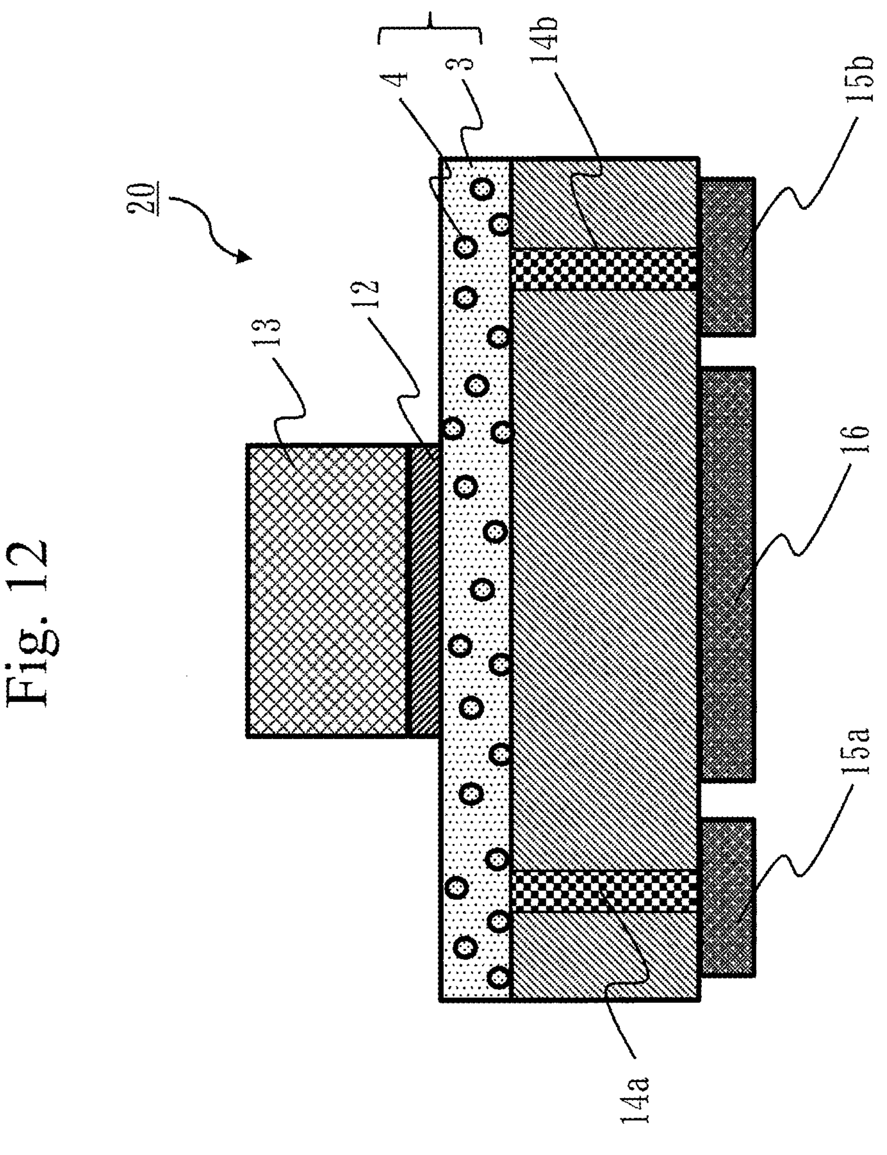
FIG. 12 is a sectional schematic diagram of a circulator 20 according to Embodiment 2.

FIG. 12 illustrates a specific example of a sectional schematic diagram of the circulator 20 according to Embodiment 2. As illustrated in FIG. 12, in the circulator 20, a permanent magnet 13 is mounted on a surface of the conductor pattern 5 of the magnetic ceramic substrate 1 according to Embodiment 1 via a spacer 12. A through-hole conductor 14*a* and a through-hole conductor 14*b* are formed in the magnetic ceramic substrate 1. The conductor pattern 5 and an input/output terminal 15*a* are electrically connected to each other via the through-hole conductor 14*a*, and the conductor pattern 5 and an input/output terminal 15*b* are electrically connected to each other via the through-hole conductor 14*b*. Further, the magnetic ceramic substrate 1 is provided with a ground conductor 16.

Figure 13:
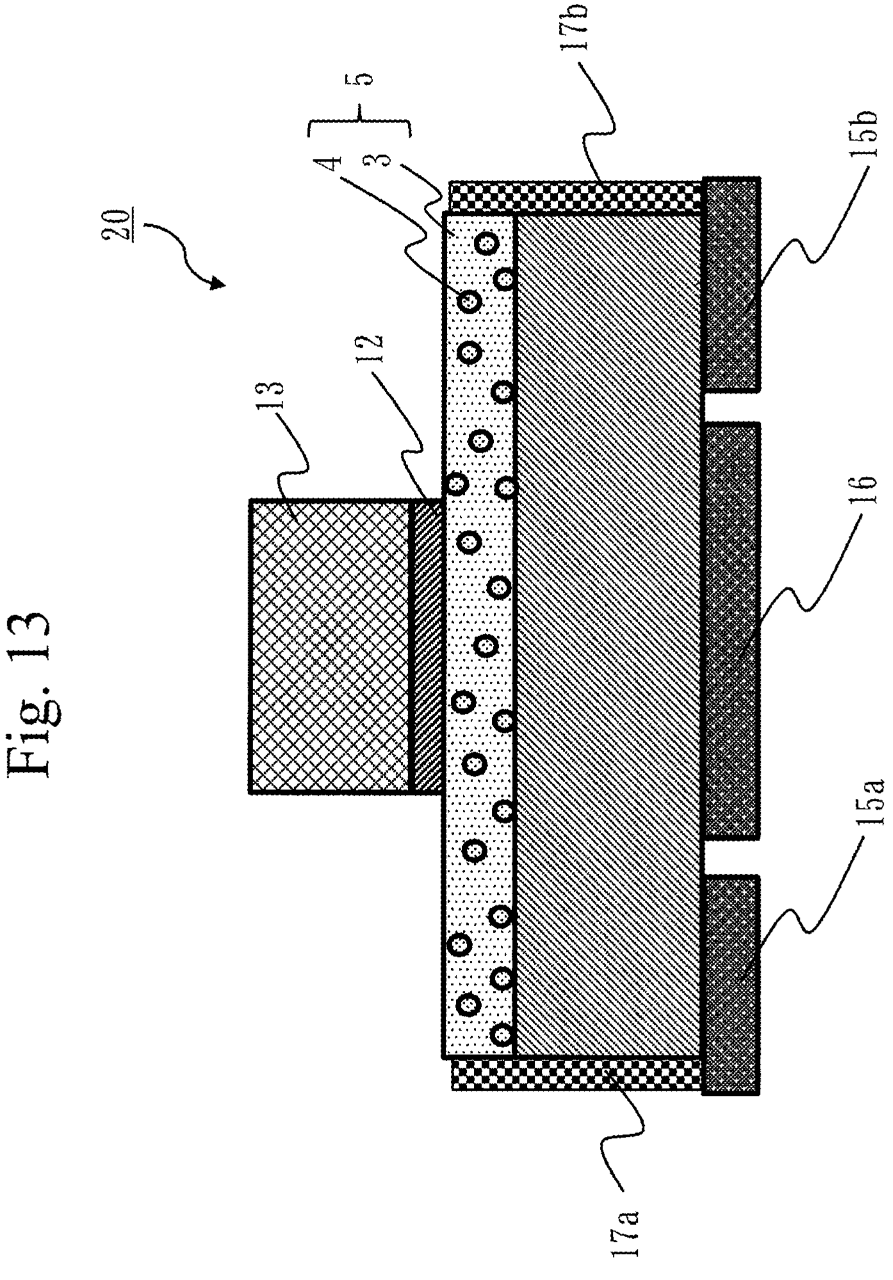
FIG. 13 is a sectional schematic diagram of a circulator 20 according to Embodiment 2.

The permanent magnet 13 is not particularly limited, and may be a metal magnet such as a neodymium-iron-boron magnet, a samarium-cobalt magnet, an Al—Ni—Co magnet, and an iron-chromium-cobalt magnet, or may be a ceramic magnet such as a hexagonal ferrite magnet. As a method for electrically connecting the conductor pattern 5 to each of the input/output terminal 15*a* and the input/output terminal 15*b*, other than a method for making connection via through-hole conductors 14, a method for making connection via a side-surface conductor 17*a* and a side-surface conductor 17*b* which are formed on side surfaces of the magnetic ceramic substrate 1 as illustrated in FIG. 13 may be employed.

A method for mounting the permanent magnet 13 and a method for mounting the through-hole conductors 14 are not particularly limited, and a method known in a technical field related to these methods may be employed.

Description of Effect of Embodiment 2

As described above, according to Embodiment 2, the circulator 20 having excellent adhesion between the conductor pattern 5 and the base material 2 and excellent plating adhesion on the surface of the conductor pattern 5 can be provided.

Other Embodiments

Any combination of the embodiments described above can be made. An arbitrary constituent element of each embodiment can be deformed. Also, in each embodiment, an arbitrary constituent element can be omitted.

The embodiments are not limited to those indicated as Embodiments 1 to 2. Various changes may be made to the embodiments as necessary.

REFERENCE SIGNS LIST

1: magnetic ceramic substrate; 2: base material; 3: metal conductor; 4: amorphous glass; 5: conductor pattern; 6: protrusion; 7: microcrack; 8: crystalline glass; 9: second-layer conductor pattern; 10: non-smooth base material; 11: gap; 12: spacer; 13: permanent magnet; 14, 14*a*, 14*b*: through-hole conductor; 15*a*, 15*b*: input/output terminal; 16: ground conductor; 17*a*, 17*b*: side-surface conductor; 20: circulator.

The invention claimed is:

1. A magnetic ceramic substrate comprising:

a base material made of magnetic ceramic that is garnet-type ferrite; and a conductor pattern formed to be in contact with a surface of the base material, wherein a value of Ra is 0.01 or more and 0.5 or less where Ra is a smoothness of the surface of the base material, and wherein the conductor pattern is made of a metal conductor formed of Ag and amorphous glass that does not crystallize.

2. The magnetic ceramic substrate according to claim 1, wherein $T_{sin}-T_{sof}$ is 100° C. or more and 300° C. or less where $T_{sof}$ is a softening temperature of the amorphous glass contained in the conductor pattern and $T_{sin}$ is a sintering temperature of the metal conductor contained in the conductor pattern.

3. The magnetic ceramic substrate according to claim 1, wherein part of a surface of the amorphous glass constituting the conductor pattern is bonded to the surface of the base material.

4. The magnetic ceramic substrate according to claim 3, wherein the surface of the amorphous glass partly bonded to the surface of the base material is, except for the part bonded to the surface of the base material, in contact with the metal conductor.

5. The magnetic ceramic substrate according to claim 1, wherein the conductor pattern has a thickness of 10 μm or more and 20 μm or less.

6. The magnetic ceramic substrate according to claim 1, wherein an amount of amorphous glass contained in the conductor pattern is 2 vol % or more and 12 vol % or less with respect to a volume of the conductor pattern.

7. The magnetic ceramic substrate according to claim 1, wherein the conductor pattern is constituted of a first-layer conductor pattern formed to be in contact with the surface of the base material, and a second-layer conductor pattern formed to be in contact with a surface of the first-layer conductor pattern, wherein the first-layer conductor pattern is made of a metal conductor and amorphous glass that does not crystallize, and wherein the second-layer conductor pattern is made of a metal conductor.

8. A circulator comprising the magnetic ceramic substrate according to claim 1.

9. A magnetic ceramic substrate manufacturing method of manufacturing a magnetic ceramic substrate, the magnetic ceramic substrate manufacturing method comprising:

mirror-polishing a surface of a base material made of magnetic ceramic that is garnet-type ferrite such that a value of Ra is 0.01 or more and 0.5 or less where Ra is a smoothness of the surface of the base material;

applying a conductor paste made of a metal conductor formed of Ag and amorphous glass that does not crystallize by thick-film printing to the mirror-polished surface;

drying the conductor paste applied by thick-film printing; and baking the dried conductor paste to the surface of the base material.

10. The magnetic ceramic substrate manufacturing method according to claim 9, wherein $T_{sin}-T_{sof}$ is 100° C. or more and 300° C. or less where $T_{sof}$ is a softening temperature of the amorphous glass contained in the conductor paste and $T_{sin}$ is a sintering temperature of the metal conductor contained in the conductor paste.

* * * * *